United States Patent
Hamazaki

(10) Patent No.: US 8,486,212 B2
(45) Date of Patent: *Jul. 16, 2013

(54) METHOD AND APPARATUS FOR MOUNTING ELECTRIC COMPONENT

(75) Inventor: Kazunori Hamazaki, Kanuma (JP)

(73) Assignee: Dexerials Corporation, Tokyo (JP)

( * ) Notice: Subject to any disclaimer, the term of this patent is extended or adjusted under 35 U.S.C. 154(b) by 328 days.

This patent is subject to a terminal disclaimer.

(21) Appl. No.: 12/747,129

(22) PCT Filed: Nov. 13, 2008

(86) PCT No.: PCT/JP2008/070691
§ 371 (c)(1),
(2), (4) Date: Jul. 30, 2010

(87) PCT Pub. No.: WO2009/075160
PCT Pub. Date: Jun. 18, 2009

(65) Prior Publication Data
US 2010/0288416 A1    Nov. 18, 2010

(30) Foreign Application Priority Data
Dec. 10, 2007 (JP) .................................. 2007-318751

(51) Int. Cl.
*B29C 65/00* (2006.01)
(52) U.S. Cl.
USPC ........ 156/228; 156/295; 156/297; 156/307.7; 438/15; 438/118
(58) Field of Classification Search
USPC .......... 156/228, 538, 580, 581, 583.1, 583.3, 156/295, 297, 306.6, 307.7; 438/15, 118; 257/E21.505, E21.519
See application file for complete search history.

(56) References Cited

U.S. PATENT DOCUMENTS

| | | | | |
|---|---|---|---|---|
| 3,699,640 | A | * | 10/1972 | Cranston et al. .............. 228/106 |
| 4,511,425 | A | * | 4/1985 | Boyd et al. .................... 156/493 |
| 6,244,493 | B1 | * | 6/2001 | Shimazaki et al. ........... 228/5.5 |
| 6,605,491 | B1 | * | 8/2003 | Hsieh et al. ................... 438/118 |
| 7,556,190 | B2 | * | 7/2009 | Matsumura et al. ..... 228/180.21 |
| 2004/0238115 | A1 | | 12/2004 | Matsuno et al. |
| 2006/0113356 | A1 | | 6/2006 | Matsumura et al. |

FOREIGN PATENT DOCUMENTS

| | | |
|---|---|---|
| JP | 2003-086635 | 3/2003 |
| JP | 2005-032952 | 2/2005 |

OTHER PUBLICATIONS

International Search Report dated Jan. 5, 2009, for corresponding Patent Application PCT/JP2008/070691.

* cited by examiner

*Primary Examiner* — James Sells
(74) *Attorney, Agent, or Firm* — K&L Gates LLP

(57) ABSTRACT

An electronic component mounting apparatus is capable of significantly reducing a warpage amount of an electronic component warped in a case of thermocompression bonding using a conductive adhesive agent having conductive particles and a low minimum melt viscosity where a thin electronic component having a thickness smaller than or equal to 200 μm is mounted on a wiring board. In the mounting apparatus, an anisotropic conductive adhesive film having the minimum melt viscosity lower than or equal to $1.0 \times 10^3$ Pa·s is placed on a wiring board placed on a base, and an IC chip having a thickness smaller than or equal to 200 μm is placed on the anisotropic conductive adhesive film. In the mounting apparatus, the IC chip is pressurized by a thermocompression bonding head having a compression bonding portion made of elastomer having a rubber hardness lower than or equal to 60, so that the IC chip is bonded onto the wiring board by thermocompression.

6 Claims, 2 Drawing Sheets

METHOD AND APPARATUS FOR MOUNTING ELECTRIC COMPONENT

CROSS REFERENCE TO RELATED APPLICATIONS

The present application is a National Stage of International Application No. PCT/JP2008/070691 filed on Nov. 13, 2008 and which claims priority to Japanese Patent Application No. 2007-318751 filed on Dec. 10, 2007, the entire contents of which are being incorporated herein by reference.

BACKGROUND

The present disclosure relates to a method and an apparatus for mounting an electric component such as a semi-conductor chip on a wiring board. More particularly, the present disclosure relates to a method and an apparatus for mounting an electric component using an adhesive agent.

A variety of electronic devices are expected to be smaller or thinner in size as the electronic devices including mobile phones have been rapidly widespread in recent years. A variety of electronic components such as a large scale integration (LSI) chip and the like need to be densely mounted on a wiring board to meet such a recent demand for the smaller or thinner electronic devices.

Accordingly, the electronic component tends to be mounted on the wiring board in a state that the electronic component remains as a chip, that is, the electronic component tends to be mounted on the wiring board using a bare chip mounting technique, as a flexible printed wiring board (also referred to as a flexible printed circuit or FPC) has been widespread while a high density mounting has been demanded. Such a method for directly mounting the bare chip on the wiring board is known to use an adhesive agent.

For example, in a case where an anisotropic conductive adhesive film (also referred to as an anisotropic conductive film or ACF) is used for the mounting, the electronic component is placed on the wiring board including the anisotropic conductive adhesive film attached thereto, and then the electronic component is pressurized and heated using a flat hard head made of metal or ceramics and the like, so that the anisotropic conductive adhesive film is hardened by a thermocompression bonding mounting technique.

In such a case of mounting the electronic component by application of the pressure and heat using the hard head, however, sufficient heat may not be applied with respect to a fillet portion of the adhesive agent in the vicinity of the electronic component during the thermocompression bonding, causing deterioration of connection reliability. Moreover, a plurality of electronic components are difficult to be mounted.

Accordingly, a technique (e.g., Patent Document 1) has been proposed in recent years to enhance the connection reliability by applying uniform pressure on a pressure surface of the electronic component by performing the thermocompression bonding of the electronic component using a fat elastic head made of an elastic body such as silicone rubber. Patent Document 1 discloses the deterioration of the connection reliability and initial resistance of the adhesive agent due to application of insufficient pressure with respect to the electronic component where the elastic member is made of elastomer having rubber hardness below 40, and the deterioration of the connection reliability due to generation of voids in binding resin of the adhesive agent caused by application of insufficient pressure with respect to the fillet portion where the elastic member made of the elastomer has a rubber hardness greater than or equal to 80. In a case of mounting the electronic component using the elastic head, therefore, the elastic head preferably a rubber hardness between 40 and 80.
Patent Document 1: Japanese Unexamined Patent Application Publication No. 2005-32952.

In addition, the electronic components to be mounted have tended to be thin in recent years as the electronic devices are expected to be smaller or thinner in size or lighter in weight.

The usage of the elastic head having the preferred rubber hardness disclosed in Patent Document 1 causes an influence on the connection reliability due to a significant increase in a warpage amount of a thin electronic component warped subsequent to the thermocompression bonding in a case where the thin electronic component is mounted using a conductive adhesive agent such as an anisotropic conductive adhesive film having a low melt viscosity.

SUMMARY

The present embodiments provide a method and an apparatus for mounting an electronic component to enhance connection reliability by proposing a new mounting condition and significantly reducing a warpage amount of the electronic component warped subsequent to thermocompression bonding in a case where an elastic head is allowed to perform the thermocompression bonding using a conductive adhesive agent having conductive particles.

Investigations were performed regarding a method for thermocompression bonding using a conductive adhesive agent having conductive particles and a low minimum melt viscosity where a thin electronic component having a thickness smaller than or equal to 200 µm is mounted on a wiring board. A condition of an elastic head was found to significantly reduce a warpage amount of the electronic component warped subsequent to the thermocompression bonding.

According to one embodiment, a method for mounting an electronic component onto a wiring board by thermocompression bonding. The mounting method includes: a first step for allowing a conductive adhesive agent having a minimum melt viscosity lower than or equal to $1.0 \times 10^3$ Pa·s to be placed on the wiring board placed on a base and allowing the electronic component having a thickness smaller than or equal to 200 µm to be placed on the conductive adhesive agent; and a second step for allowing the electronic component to be pressurized using a thermocompression bonding head having a compression bonding portion made of elastomer having a rubber hardness lower than or equal to 60 to perform the thermocompression bonding of the electronic component onto the wiring board.

According to another embodiment, a mounting apparatus capable of mounting an electronic component onto a wiring board by thermocompression bonding is provided. The mounting apparatus includes: a base allowing the wiring board to be placed thereon; and a thermocompression bonding head performing the thermocompression bonding of the electronic component onto the wiring board by pressurizing the electronic component in a state that a conductive adhesive agent having a minimum melt viscosity lower than or equal to $1.0 \times 10^3$ Pa·s is placed on the wiring board placed on the base, and the electronic component having a thickness smaller than or equal to 200 μm is placed on the conductive adhesive agent. The thermocompression bonding head includes a compression bonding portion made of elastomer having a rubber hardness lower than or equal to 60.

The method and apparatus for mounting the electronic component according to the embodiment can reduce an occurrence of unnecessarily removing the binding resin of the conductive adhesive agent from a lower surface region of the electronic component to outside during the thermocompression bonding even in a case of using a conductive adhesive agent having a low minimum melt viscosity and a large fluidity at the time of the thermocompression bonding since the thermocompression bonding head includes the compression bonding portion having a low rubber hardness. Therefore, the method and apparatus for mounting the electronic component according to the embodiment can allow the binding resin of the conductive adhesive agent to surely stay on the lower surface region of the electronic component subsequent to the thermocompression bonding.

Since the embodiment can enable the binding resin of the conductive adhesive agent to surely stay on the lower surface region of the electronic component subsequent to the thermocompression bonding, the connection reliability can be enhanced by significantly reducing the warpage amount of the electronic component warped subsequent to the thermocompression bonding and reducing the likelihood of generating a void.

Additional features and advantages are described herein, and will be apparent from, the following Detailed Description and the figures.

DETAILED DESCRIPTION

According to an embodiment, a mounting apparatus allows an electronic component such as a semi-conductor IC chip to be mounted on a wiring board such as a printed wiring board. Particularly, in a case where the mounting apparatus uses an elastic head serving as a head to perform thermocompression bonding of the electronic component having a thickness smaller than or equal to a prescribed value, and uses a conductive adhesive agent having a minimum melt viscosity lower than or equal to a prescribed value, a mounting is performed based on an appropriate mounting condition.

A description below is given using an anisotropic conductive adhesive film (also referred to as an anisotropic conductive film or ACF) serving as a conductive adhesive agent for the sake of simplicity. The anisotropic conductive adhesive film is made of a material including fine conductive particles dispersed in a sheet-shaped thermosetting resin. The anisotropic conductive adhesive film has an adhesion function and an electrical connection function in a thickness direction through the conductive particles by application of the heat and pressure thereto, and also has an insulation function in the thickness direction and a vertical direction.

Figure 1:
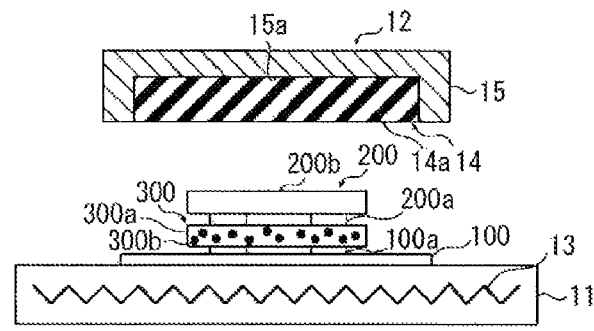
FIG. 1 is a schematic diagram illustrating a mounting apparatus according to an embodiment.

Referring to FIG. 1, the mounting apparatus includes: a base 11 on which a wiring board 100 including a wiring pattern 100a formed thereon is placed; and a thermocompression bonding head 12 applying pressure and heat to an IC chip 200, serving as the electronic component, including a bump 200a such as a gold stud bump.

The base 11 is, for example, made of prescribed metal or ceramic, and includes a heater 13 thereinside for heating. The base 11 undergoes the pressure applied by the thermocompression bonding head 12 through a flat compression bonding surface to be contacted with the thermocompression bonding head 12, thereby pressurizing the wiring board 100 and the IC chip 200.

The thermocompression bonding head 12 includes a compression boding portion 14 including a compression bonding surface 14a in the form of flat to perform the thermocompression bonding of the IC chip 200, and the compression boding portion 14 is at least made of a prescribed elastic body. Particularly, the thermocompression bonding head 12 includes a head body 15, for example, made of prescribed metal, and a heater (not shown) disposed thereinside for heating. The head body 15 includes a recessed portion 15a in a region opposite to the base 11, and the recessed portion 15a is formed in such a manner that the compression bonding portion 14 made of a plate-shaped elastic body is provided in close contact therewith.

The compression bonding portion 14 is disposed in such a manner that the compression boding surface 14a is arranged in parallel to the flat compression bonding surface of the base 11. The compression bonding portion 14 is formed in such a manner that the compression boding surface 14a has an area that is larger than that of a top surface 200b of the IC chip 200 and has a thickness that is greater than or equal to that of the IC chip 200. Since the IC chip 200 applied to the present invention has a thickness smaller than or equal to 200 μm, the compression boding portion 14 can have a thickness greater than or equal to 200 μm to correspond to the IC chip 200.

The elastic body forming the compression bonding portion 14 preferably has the rubber hardness lower than or equal to 60 from the standpoint of enhancement of the connection reliability by significantly reducing the warpage amount of the IC chip 200 warped subsequent to the thermocompression bonding. Such preference is attributed to an anisotropic conductive adhesive film 300 having the low melt viscosity as described later. That is, the low melt viscosity of the anisotropic conductive adhesive film 300 indicates that a binding resin 300a provided between the wiring board 10 and the IC chip 200 has a large fluidity during the thermocompression bonding, causing generation of a state that the binding resin 300a tends to be removed to outside from a lower surface region of the IC chip 200. In a case where the compression bonding portion 14 is formed using an elastic body having excess rubber hardness in such a state that the binding resin 300a tends to be removed, the binding resin 300a is removed easily, causing an increase in the warpage amount of the IC chip warped subsequent to the thermocompression bonding and deterioration of the connection reliability. In the mounting apparatus according to the embodiment, therefore, the compression bonding portion 14 is formed of the elastic body having the rubber hardness lower than or equal to 60 to avoid the above disadvantage. A lower limit of the rubber hardness is preferably approximately 15 from the standpoint of avoidance of rubber characteristic deterioration caused by a decrease in heat resistance. As long as the elastic body forming the compression bonding portion 14 has the rubber hardness lower than or equal to 60, the elastic body can be made of any elastomer such as natural rubber or synthetic rubber. However, the elastic body is preferably made of silicone rubber from the standpoint of a heat resistance property and a pressure resistance property.

Figure 2:
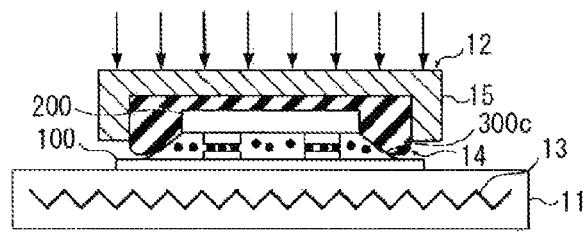
FIG. 2 is a schematic diagram illustrating a thermocompression bonding process using the mounting apparatus according to the embodiment.

The thermocompression bonding head 12 is movably provided in a vertical direction by a prescribed drive mechanism (not shown). The thermocompression bonding head 12 is moved in a downward direction until contacting the top surface 200b or a side surface of the IC chip 200 as illustrated in FIG. 2, thereby pressurizing the IC chip 200 disposed between the base 11 and thereof.

In a case where the IC chip 200 is mounted by the mounting apparatus having the above structure, the wiring board 100 is placed on the base 11, and the anisotropic conductive adhesive film 300 including the fine conductive particles 300b dispersed in the prescribed binding resin 300a is placed on the wiring board 100. The anisotropic conductive adhesive film 300 serves as the adhesive agent having the minimum melt viscosity lower than or equal to $1.0 \times 10^3$ Pa·s. Practically, a lower limit of the minimum melt viscosity of the anisotropic conductive adhesive film 300 serving as the adhesive agent is approximately $1.0 \times 10^2$ Pa·s. The melt viscosity of the anisotropic conductive adhesive film 300 serving as the adhesive agent is not influenced by the presence or absence of dispersion of the conductive particles 300b as long as an amount of the conductive particles 300b to be dispersed in the binding resin 300a is small. In the mounting apparatus, the IC chip 200 is placed on the anisotropic conductive adhesive film 300, and the heater 13 is heated while the thermocompression bonding head 12 is performing the pressurization by moving in the downward direction until the compression bonding surface 14a thereof contacts the top surface 200b or the side surface of the IC chip 200 through a protective film (not shown), so that temporary compression bonding is performed under a prescribed condition, and actual compression bonding is performed under a condition described below.

That is, the mounting apparatus allows the side of the IC chip 200 to be heated at a prescribed temperature and the side of the wiring board 10 to be heated at a higher temperature than the prescribed temperature during the actual compression bonding. Particularly, the mounting apparatus allows the heater disposed in the thermocompression bonding head 12 to be controlled by a prescribed control device (not shown) in such a manner that the temperature of the compression bonding portion 14 becomes approximately 100 degrees Celsius, and allows the heater 13 disposed in the base 11 to be controlled by the prescribed control device (not shown) in such a manner that the temperature of the base 11 becomes approximately 200 degrees Celsius, thereby heating the binding resin 300a of the anisotropic conductive adhesive film 300 to be approximately 180 degrees Celsius. The base 11 can be heated by a constant heat method by which the heater 13 is heated from the beginning to maintain the temperature of the base 11 at a prescribed temperature, or a pulse heat method by which the base 11 begins to be heated from a state that the base 11 is initially set at a normal temperature or at a temperature not allowing the anisotropic conductive adhesive film 300 to be harden. Any of the constant heat method and the pulse heat method can be applied to heat the base 11. The mounting apparatus pressurizes the IC chip 200 with the heat. The pressure to be applied during the actual compression bonding is approximately greater than or equal to 5 kgf and lower than or equal to 15 kgf (greater than or equal to 50 N and lower than or equal to 150 N) per IC chip 200, and the mounting apparatus preferably pressurizes the IC chip 200 for longer than or equal to 10 seconds.

Accordingly, where the IC chip 200 having the thickness smaller than or equal to 200 μm is mounted by the mounting apparatus using the anisotropic conductive adhesive film 300 having the minimum melt viscosity lower than or equal to $1.0 \times 10^3$ Pa·s, the pressurization is performed by the compression bonding portion 14 made of the elastomer having the rubber hardness lower than or equal to 60, so that the binding resin 300a of the anisotropic conductive adhesive film 300 is not removed unnecessarily. Therefore, the mounting apparatus can significantly reduce the warpage amount of the IC chip 200 warped subsequent to the thermocompression bonding, and can enhance the connection reliability by reducing the likelihood of void generation.

In the mounting apparatus, the pressurization using the compression bonding portion 14 made of the elastomer having the rubber hardness lower than or equal to 60 allows application of a prescribed pressure with respect to the top surface 200b of the IC chip 200, so that the fillet portion 300c on the side of the IC chip 200 is uniformly applied with the pressure that is lower than that applied with respect to the top surface 200b. Therefore, the mounting apparatus not only allows a connection portion between the IC chip 200 and the wiring board 100 to be applied with the sufficient pressure, but also allows the fillet portion 300c in the vicinity of the IC chip 200 to be applied with the pressure in such a manner as not to generate the void, thereby connecting the IC chip 200 using the anisotropic conductive adhesive film 300 with high reliability. Particularly, since the thickness of the compression bonding portion 14 is formed in a manner as to be greater than or equal to that of the IC chip 200 in the mounting apparatus, the top surface 200b of the IC chip 200 and the fillet portion 300c on the side of the IC chip 200 can be surely pressurized with appropriate pressure.

Moreover, the side of the IC chip 200 is heated at the prescribed temperature, and the side of the wiring board 10 is heated at higher temperature than the prescribed temperature in the mounting apparatus during the thermocompression bonding, so that the fillet portion 300c in the vicinity of the IC chip 200 can be heated sufficiently, thereby reducing the generation of the void.

The present embodiment can be applied to a case where a plurality of IC chips are simultaneously bonded onto a wiring board by thermocompression, although the above embodiment is described using a case where only one IC chip is bonded onto the wiring board by the thermocompression.

Figure 3:
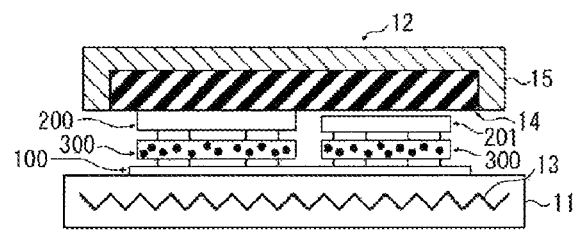
FIG. 3 is a schematic diagram illustrating another structure of the mounting apparatus according to the embodiment.

For example, in a case where two IC chips are simultaneously bonded onto a wiring board by the thermocompression, a mounting apparatus can be structured as illustrated in FIG. 3. The mounting apparatus of FIG. 3 is formed in such a manner that an area of a compression bonding surface 14a is larger than that of two IC chips 200, 201 each of which having a thickness smaller than or equal to 200 μm. In such a case, the mounting apparatus uses a component having the rubber hardness lower than or equal to 60 as an elastic body forming a compression bonding portion 14, and a component having the minimum melt viscosity lower than or equal to $1.0 \times 10^3$ Pa·s as an adhesive agent of an anisotropic conductive adhesive film 300, so that the IC chips 200, 201 and a wiring board 100 are heated.

According to the mounting apparatus, therefore, even in a case where each of plural IC chips 200, 201 has a different thickness, the IC chips 200, 201 can be mounted simultaneously with the high reliability, thereby significantly enhancing the mounting efficiency.

The above embodiment is described using a case where the IC chip is mounted using the anisotropic conductive adhesive film. However, the present invention may be applied to a case where an adhesive agent, such as an anisotropic conductive paste (ACP) and the like, having the conductive particles 300b with the minimum melt viscosity lower than or equal to $1.0 \times 10^3$ Pa·s is used.

Moreover, the above embodiment is described using a case where the IC chip having the bump is mounted. However, the embodiment can be applied to a case where an IC chip having no bump or another electronic component is mounted.

Example

Hereinafter, a particular example of the mounting apparatus according to the embodiment will be described based on an experimental result.

An IC chip was mounted on a prescribed wiring board placed on a base using the thermocompression bonding apparatus including the base and a thermocompression bonding head, and measured a warpage amount of the IC chip warped subsequent to the thermocompression bonding.

The thermocompression bonding head including a compression bonding portion made of four types of elastomer having the rubber hardness of 15, 40, 60, and 80 was used. A thermosetting anisotropic conductive adhesive film (available from Sony Chemical & Information Device Corporation) formed by blending the conductive particles having a prescribed weight % into an epoxy-type adhesive agent was used as an adhesive agent. Herein, two types of the thermosetting anisotropic conductive adhesive films having a minimum melt viscosity of $1.0 \times 10^3$ Pa·s and a minimum melt viscosity of $1.0 \times 10^4$ Pa·s were used. Accordingly, the mounting apparatus and the anisotropic conductive adhesive film allowed the temperature of each of the anisotropic conductive adhesive films to be controlled to be 180 degrees Celsius, and then performed the thermocompression bonding as similar to mass production of actual machines so as to mount the IC chips having the thickness of 100 μm, 200 μm, and 400 μm onto the wiring boards. Herein, the thermocompression bonding was performed with the pressure of 10 kgf per IC chip.

Figure 4:
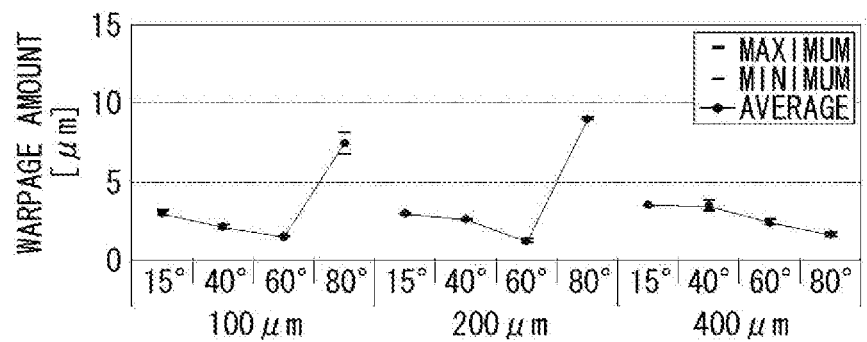
FIG. 4 is a schematic diagram illustrating a measurement result of a warpage amount of an IC chip warped subsequent to the thermocompression bonding where an anisotropic conductive adhesive film having a minimum melt viscosity of $1.0 \times 10^3$ Pa·s is used.
Figure 5:
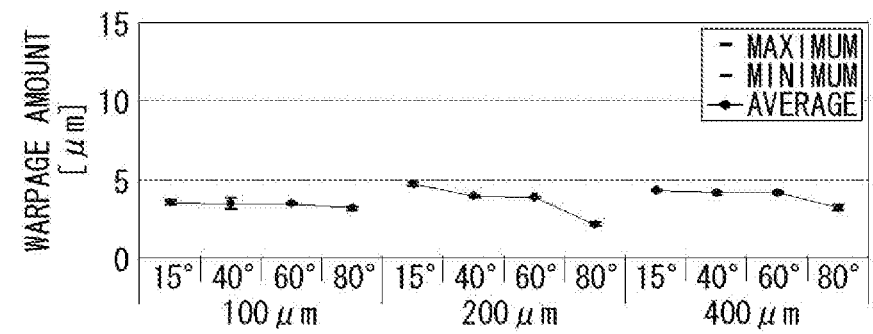
FIG. 5 is a schematic diagram illustrating a measurement result of a warpage amount of an IC chip warped subsequent to the thermocompression bonding where an anisotropic conductive adhesive film having a minimum melt viscosity of $1.0 \times 10^4$ Pa·s is used.

The warpage amount of each of the mounted IC chips subsequent to the thermocompression bonding was measured. A measurement result in a case of using the anisotropic conductive adhesive film having the minimum melt viscosity of $1.0 \times 10^3$ Pa·s is illustrated in TABLE 1 and FIG. 4. A measurement result in a case of using the anisotropic conductive adhesive film having the minimum melt viscosity of $1.0 \times 10^4$ Pa·s is illustrated in TABLE 2 and FIG. 5.

TABLE 1

| | CHIP THICKNESS | | | | | | | | | | | |
|---|---|---|---|---|---|---|---|---|---|---|---|---|
| | 100 μm | | | | 200 μm | | | | 400 μm | | | |
| | MIN. MELT VISCOSITY | | | | | | | | | | | |
| | $1.0 \times 10^3$ Pa·s | | | | $1.0 \times 10^3$ Pa·s | | | | $1.0 \times 10^3$ Pa·s | | | |
| RUBBER HARDNESS | 15° | 40° | 60° | 80° | 15° | 40° | 60° | 80° | 15° | 40° | 60° | 80° |
| PRESSURE | 10 kgf | 10 kgf | 10 kgf | 10 kgf | 10 kgf | 10 kgf | 10 kgf | 10 kgf | 10 kgf | 10 kgf | 10 kgf | 10 kgf |
| MAX. WARPAGE AMOUNT [μm] | 3.130 | 2.250 | 1.510 | 8.110 | 2.990 | 2.610 | 1.340 | 9.120 | 3.510 | 3.800 | 2.610 | 1.720 |
| MIN. WARPAGE AMOUNT [μm] | 2.810 | 1.930 | 1.470 | 6.740 | 2.900 | 2.550 | 1.110 | 8.870 | 3.440 | 3.120 | 2.220 | 1.490 |
| AVERAGE WARPAGE AMOUNT [μm] | 2.970 | 2.090 | 1.490 | 7.425 | 2.945 | 2.580 | 1.225 | 8.995 | 3.475 | 3.460 | 2.415 | 1.605 |

TABLE 2

| | CHIP THICKNESS | | | | | | | | | | | |
|---|---|---|---|---|---|---|---|---|---|---|---|---|
| | 100 μm | | | | 200 μm | | | | 400 μm | | | |
| | MIN. MELT VISCOSITY | | | | | | | | | | | |
| | $1.0 \times 10^4$ Pa·s | | | | $1.0 \times 10^4$ Pa·s | | | | $1.0 \times 10^4$ Pa·s | | | |
| RUBBER HARDNESS | 15° | 40° | 60° | 80° | 15° | 40° | 60° | 80° | 15° | 40° | 60° | 80° |
| PRESSURE | 10 kgf | 10 kgf | 10 kgf | 10 kgf | 10 kgf | 10 kgf | 10 kgf | 10 kgf | 10 kgf | 10 kgf | 10 kgf | 10 kgf |
| MAX. WARPAGE AMOUNT [μm] | 3.610 | 3.780 | 3.500 | 3.240 | 4.780 | 4.010 | 3.890 | 2.220 | 4.380 | 4.220 | 4.210 | 3.330 |
| MIN. WARPAGE AMOUNT [μm] | 3.380 | 3.100 | 3.330 | 3.010 | 4.550 | 3.780 | 3.780 | 2.040 | 4.210 | 4.000 | 4.100 | 3.040 |
| AVERAGE WARPAGE AMOUNT [μm] | 3.495 | 3.440 | 3.415 | 3.125 | 4.665 | 3.895 | 3.835 | 2.130 | 4.295 | 4.110 | 4.155 | 3.185 |

Where the anisotropic conductive adhesive film having the minimum melt viscosity of $1.0 \times 10^3$ Pa·s is used, the followings are found based on the measurement results. The warpage amount for any thickness of the IC chip warped subsequent to the thermocompression bonding is below 5 μm where the thermocompression bonding is performed using the compression boding portion having the rubber hardness lower than or equal to 60. Where the IC chip having the thickness smaller than or equal to 200 μm is bonded onto the wiring board by the thermocompression using the compression boding portion having the rubber hardness of 80, on the other hand, the warpage amount is significantly increased. That is, where a thin IC chip is mounted using the anisotropic conductive adhesive film having the minimum melt viscosity of $1.0 \times 10^3$ Pa·s, the binding resin of the anisotropic conductive adhesive film is not removed unnecessarily by arranging the compression bonding portion to have the rubber hardness lower than or equal to 60, so that the IC chip and the wiring pattern on the wiring board can be surely connected with small pressure. Such connection of the IC chip and the wiring pattern of the wiring board with the small pressure can be confirmed by a rapid increase in the warpage amount of the IC chip where the compression bonding portion is arranged to have the rubber hardness of 80, or by a small warpage amount of the IC chip warped subsequent to the thermocompression bonding where the IC chip having the thickness of 400 μm is bonded by the thermocompression using the compression bonding portion having the rubber hardness of 80.

According to the mounting apparatus of the embodiment, therefore, where the IC chip has the thickness smaller than or equal to 200 μm, the rubber hardness of the compression bonding portion and the minimum melt viscosity of the adhesive agent can be appropriately arranged, thereby significantly reducing the warpage amount of the IC chip warped subsequent to the thermocompression bonding. Such an appropriate arrangement may be particularly effective for an IC chip to be mounted in the fine-pitch arrangement.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method for mounting an electronic component onto a wiring board by thermocompression bonding, the method comprising:

placing a conductive adhesive agent having a minimum melt viscosity lower than or equal to $1.0 \times 10^3$ Pa·s on the wiring board placed on a base and placing the electronic component having a thickness smaller than or equal to 200 μm on the conductive adhesive agent, as a first step; and pressurizing the electronic component using a thermocompression bonding head having a compression bonding portion made of elastomer having a rubber hardness lower than or equal to 60 to perform the thermocompression bonding of the electronic component onto the wiring board, as a second step.

2. The method for mounting the electronic component according to claim 1, wherein the second step allows the thermocompression bonding head to pressurize a top surface region of the electronic component with respect to the wiring board with a prescribed pressure and a side surface region of the electronic component with a pressure being smaller than that applied with respect to the top surface region.

3. The method for mounting the electronic component according to claim 2, wherein the compression bonding portion is formed in such a manner that an area of a compression bonding surface is larger than that of the top surface of the electronic component and a thickness thereof is greater than or equal to that of the electronic component.

4. The method for mounting the electronic component according to claim 1, wherein the second step allows a side close to the electronic component to be heated at a prescribed temperature and a side close to the wiring board to be heated at a temperature being higher than the prescribed temperature.

5. The method for mounting the electronic component according to claim 1, wherein the second step allows the thermocompression bonding head to pressurize the electronic component with a pressure being greater than or equal to 5 kgf and smaller than or equal to 15 kgf per the electronic component.

6. The method for mounting the electronic component according to claim 1, wherein the conductive adhesive agent is an anisotropic conductive adhesive film including conductive particles dispersed in binding resin.

* * * * *